(12) United States Patent
Dai et al.

(10) Patent No.: US 9,190,897 B2
(45) Date of Patent: Nov. 17, 2015

(54) HIGH-VOLTAGE HEAVY-CURRENT DRIVE CIRCUIT APPLIED IN POWER FACTOR CORRECTOR

(71) Applicant: CSMC TECHNOLOGIES FAB2 CO., LTD., Jiangsu (CN)

(72) Inventors: Guoding Dai, Jiangsu (CN); Yue Chen, Jiangsu (CN); Xiaohui Ma, Jiangsu (CN); Hui Han, Jiangsu (CN); Renyue Ma, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 14/358,566

(22) PCT Filed: Nov. 9, 2012

(86) PCT No.: PCT/CN2012/084379
§ 371 (c)(1),
(2) Date: May 15, 2014

(87) PCT Pub. No.: WO2013/071842
PCT Pub. Date: May 23, 2013

(65) Prior Publication Data
US 2014/0293664 A1    Oct. 2, 2014

(30) Foreign Application Priority Data

Nov. 16, 2011   (CN) .......................... 2011 1 0363627

(51) Int. Cl.
*G05F 3/02* (2006.01)
*H02M 1/42* (2007.01)
(Continued)

(52) U.S. Cl.
CPC .............. *H02M 1/4208* (2013.01); *H02M 1/08* (2013.01); *H03K 17/0412* (2013.01);
(Continued)

(58) Field of Classification Search
CPC ........... H02M 1/12; H02M 1/38; H02M 1/42;
H02M 1/4208; H02M 1/4225; H02M 1/14;
H02M 1/15; H02M 1/4266; H02M 1/44;
G05F 3/262; G05F 3/265; G05F 3/30; G05F 3/205
USPC ................................ 363/44–48; 327/53–543
See application file for complete search history.

(56) References Cited

U.S. PATENT DOCUMENTS 5,502,370 A  *  3/1996  Hall et al. ..................... 323/284
7,808,304 B1    10/2010  Zhang (Continued)

FOREIGN PATENT DOCUMENTS

CN    101697454 A    4/2010
CN    102403902 A    4/2012

OTHER PUBLICATIONS

Shi et al, "Desgin of the low-power MOSFET driver circuit for APFC," Journal of Xidian University, 2011, pp. 54-59, vol. 38, No. 1.

*Primary Examiner* — Gary L Laxton
*Assistant Examiner* — Kevin H Sprenger
(74) *Attorney, Agent, or Firm* — Muncy, Geissler, Olds & Lowe, P.C.

(57) ABSTRACT

A high-voltage heavy-current drive circuit applied in a power factor corrector, comprising a current mirroring circuit (1), a level shift circuit (3), a high-voltage pre-modulation circuit (2), a dead time control circuit (4) and a heavy-current output stage (5); the heavy-current output stage adopts a Darlington output stage structure to increase the maximum operating frequency of the drive circuit. The stabilized breakdown voltage characteristic of a voltage stabilizing diode is utilized to ensure the drive circuit operating within a safe voltage range. Adding dead time control into the level shift circuit not only prevents the momentary heavy-current from a power supply to the ground during the level conversion process, but also reduces the static power consumption of the drive circuit.

7 Claims, 4 Drawing Sheets

(51) Int. Cl.

| | |
|---|---|
| *H03K 17/687* | (2006.01) |
| *H03K 17/16* | (2006.01) |
| *H03K 17/0412* | (2006.01) |
| *H03K 17/615* | (2006.01) |
| *H02M 1/08* | (2006.01) |
| *H02M 1/12* | (2006.01) |
| *H02M 1/38* | (2007.01) |
| *H02M 1/44* | (2007.01) |

(52) U.S. Cl.
CPC .......... *H03K 17/162* (2013.01); *H03K 17/615* (2013.01); *H03K 17/687* (2013.01); *H02M 1/12* (2013.01); *H02M 1/38* (2013.01); *H02M 1/42* (2013.01); *H02M 1/44* (2013.01); *H03K 17/6877* (2013.01); *H03K 2217/0081* (2013.01)

(56) References Cited

U.S. PATENT DOCUMENTS

| | | | |
|---|---|---|---|
| 2002/0030516 | A1 | 3/2002 | Bellomo et al. |
| 2007/0013430 | A1* | 1/2007 | Owen ............................ 327/333 |
| 2009/0141524 | A1* | 6/2009 | Fagnani et al. ................. 363/89 |
| 2010/0237792 | A1* | 9/2010 | Kimura ......................... 315/219 |
| 2011/0273102 | A1* | 11/2011 | van de Ven et al. ........... 315/193 |
| 2012/0176826 | A1* | 7/2012 | Lazar ............................ 363/126 |

* cited by examiner

HIGH-VOLTAGE HEAVY-CURRENT DRIVE CIRCUIT APPLIED IN POWER FACTOR CORRECTOR

FIELD OF THE INVENTION

The present invention relates to a field of analog integrated circuits of electronic circuit technology, more particularly relates to a high-voltage heavy-current drive circuit applied in a power factor corrector, which is applied to the output stage drive of the active power factor correction controller.

BACKGROUND OF THE INVENTION

With the rapid development of power electronics, the switching mode power supply has been widely used due to its high power conversion efficiency. In a switching regulator circuit, the semiconductor switching device is the essential component. The continuous increasing of the operating frequency of the switching power supply brings wide change to the electronics industry. The researches on the semiconductor switching device also become particularly important, especially in the power MOSFET and IGBT. It is necessary to design a special drive circuit for the power device due to its special process and structure.

In a conventional power MOSFET driver circuit, the MOSFET in the driver stage will be turned on at the same time, an additional power is consumed. Furthermore, in the output stage drive circuit with a higher supply voltage, the working reliability of the drive circuit cannot be guaranteed due to the lack of the necessary protection circuit. Further still, due to the limited source current and sink current capability, the driver circuit cannot be used in some special occasions. The protection issues of the driver circuit with a higher voltage can be effectively solved in present invention; while the defects of the limited source and sink current of the conventional drive circuit can be eliminated; the static power consumption of the driver circuit can be reduced; the total harmonic distortion can be reduced; the reliability and security of the drive circuit can be ensured.

SUMMARY OF THE INVENTION

In view of the above disadvantages of the prior art, it is an object of the present invention to provide a high-voltage heavy-current drive circuit applied in a power factor corrector.

The object of the present invention is obtained by the following technical solution:

A high-voltage heavy-current drive circuit applied in a power factor corrector includes a current mirror circuit, a high-voltage pre-modulation circuit, a level shift circuit, a dead time control circuit, and a heavy-current output stage.

The current mirror circuit is configured to convert an input signal $I_{bias}$ to an input signal of the high voltage pre-modulation circuit using a current source circuit and a current sink circuit composed of a plurality of resistors and transistors. The input signal $I_{bias}$ is generated by a starting current $I_{start}$ and a reference current source. The starting current $I_{start}$ is converted to an input signal of the level shift circuit.

Under an effect of a bias of the current mirror circuit, the high voltage pre-modulation circuit is configured to convert a high input supply voltage VDD to a relative low voltage using an isolation of a high-voltage LDMOS transistor and stabilized breakdown voltage characteristics of a zener diode to ensure the drive circuit operating within a safe voltage range, and to generate an input voltage $V_{CLAMP}$ of the level shift circuit.

Under effects of an output of the high-voltage pre-modulation circuit and the bias of the current mirror circuit, the level shift circuit is configured to control on and off states of a high-voltage transistor PMOS and a high-voltage transistor NOMS using a first logic switch signal S1 and a second switch logic signal S2 generated by the dead time control circuit; thereby generating an output signal Vs of the level shift circuit to provide a logic switch signal for the heavy-current output stage.

Under an effect of an digital logic drive signal, using delays of a logic gate circuit and capacitors, the dead time control circuit is configured to generate inverse non-overlapping first logic switch signal S1 and second logic switch signal S2, and to control operating states of the level shift circuit and the heavy-current output stage.

Under an effect of a Darlington composed of high voltage transistors, using the logic switch signal $V_S$ generated by the high-voltage transistor NOMS and the level shift circuit and a second logic switch signal S2 generated by the dead time control circuit, the high current output stage is configured to generate an output drive signal GATE_DRIVER with great source current capability and sink current capability and to drive on and off states of an external power device.

Furthermore, the current mirror circuit includes transistors Q3, Q4, Q6, Q7, Q8, Q9, Q10, Q11, Q12, Q13, and Q14, and resistors R1, R2, R3, R4, and R7. A first current mirror circuit consists of the transistor Q13 and the transistor Q14. A second current mirror circuit consists of the transistors Q3, Q4, Q6, Q7, Q8, Q9, Q10, Q11, and Q12 and the resistors R1, R2, R3, R4, and R7. An input terminal of the first current mirror circuit is connected to an output terminal $I_{bias}$ of an external reference current source. The first current mirror circuit is configured to provide a bias current for the high-voltage pre-modulation circuit when the circuit is operating normally; the second current mirror circuit is configured to provide a bias current for the high-voltage pre-modulation circuit and the level shift circuit.

The high-voltage pre-modulation circuit comprises an LDMOS transistor LDMOS1, an LDMOS transistor LDMOS2, zener diodes D4, D5, and D6, and a transistor Q5. A third current mirror circuit consists of the LDMOS transistor LDMOS1 and the LDMOS transistors LDMOS2; the LDMOS transistor LDMOS1 is used as a first high-voltage insulating transistor of the high pre-modulation circuit. The LDMOS transistor LDMOS2 is used as a gate bias transistor of the LDMOS transistor LDMOS1. The zener diode D6 is used as a gate clamping protection of the third current mirror circuit; the zener diodes D4 and D5 are connected in series to form a first high-voltage pre-modulation circuit. The transistor Q5 is used as a second high-voltage insulating transistor of the high pre-modulation circuit.

In the high-voltage pre-modulation circuit, a gate and a drain of the LDMOS transistor LDMOS2 in the third current mirror circuit are connected together and connected to an output terminal of a collector of the transistor Q13 in the first current mirror circuit. A source of the LDMOS transistor LDMOS1 and the LDMOS transistors LDMOS2 is connected to the input power supply VDD. A clamping diode D6 is coupled between the gate and the source of the LDMOS transistor LDMOS1 and the LDMOS transistors LDMOS2 in the third current mirror circuit. A drain terminal of the LDMOS transistor LDMOS1 is connected to an N terminal of clamping diodes D4 and D5 connected in series, and also connected to a base of the transistor Q5, and an output terminal of a collector of the transistor Q7 in the second current mirror circuit. A high voltage pre-modulation signal $V_{CLAMP}$ is generated on an emitter of the transistor Q5.

The level shift circuit includes high-voltage PMOS transistors, PMOS1, PMOS2, PMOS3, PMOS4, and PMOS5, high-voltage NMOS transistors M3, M4, and M5, and an inverter INV1.

A source of the high-voltage PMOS transistors, PMOS1, PMOS2, and PMOS5 is connected to a common power supply $V_{CLAMP}$, namely, is connected to an output terminal of the high-voltage pre-modulation circuit.

A gate of the high-voltage PMOS transistor PMOS1 is connected to a drain of the high-voltage PMOS transistor PMOS2; a drain of the high-voltage PMOS transistor PMOS1 is connected to a gate of the high-voltage PMOS transistor PMOS2 and a source of the high-voltage PMOS transistor PMOS3.

Under an effect of a bias of a second current mirror circuit in the current mirror circuit, a collector of an output terminal of a transistor Q3 of the second current mirror circuit is connected to the drain of the high-voltage PMOS transistor PMOS1, the gate of the high-voltage PMOS transistor PMOS2, and the source of the high-voltage PMOS transistor PMOS3 to be a bias current of the level shift circuit.

The gate of the high-voltage PMOS transistor PMOS2 is connected to the drain of the high-voltage PMOS transistor PMOS1; the drain of the high-voltage PMOS transistor PMOS2 is connected to the gate of the high-voltage PMOS transistor PMOS1. A source of the high-voltage PMOS transistor PMOS4; a gate of the high-voltage PMOS transistor PMOS5.

Under an effect of the bias of the second current mirror circuit in the current mirror circuit, an output terminal of a collector of a transistor Q4 of the second current mirror circuit is connected to the gate of the high-voltage PMOS transistor PMOS1, the source of the high-voltage PMOS transistor PMOS4, and the gate of the high-voltage PMOS transistor PMOS5 to provide a bias current for the level shift circuit.

The gates of the high-voltage PMOS transistors PMOS3 and PMOS4 are connected to a common terminal $V_b$; the drain of the high-voltage PMOS transistors PMOS3 is connected to a drain of the high-voltage NMOS transistor M3. The drain of the high-voltage PMOS transistors PMOS4 is connected to a drain of the high-voltage NMOS transistor M4; a gate of the high-voltage NMOS transistor M3 is connected to an output terminal of the inverter INV1. A source of the high-voltage NMOS transistor M3 is connected to a common terminal GND.

An input terminal of the inverter INV1 is connected to the first logic switch signal S1 generated by the dead time control circuit; a gate of the high-voltage NMOS transistor M4 is connected to the input terminal of inverter INV1, namely, is connected to the first logic switch signal S1. A source of the high-voltage NMOS transistor M4 is connected to the common GND. The gate of the high-voltage NMOS transistor PMOS5 is connected to the drain of the high-voltage NMOS transistor M2, the gate of the PMOS1, and the source of the PMOS4; the source of the high-voltage NMOS transistor PMOS5 is connected to the output $V_{CLAMP}$ of the high voltage pre-modulation circuit.

The drain of the high-voltage PMOS transistor PMOS5 is connected to the drain of high-voltage NMOS transistor M5; the gate of the high-voltage NMOS transistor M5 is connected to the second switch logic signal S2 generated by the dead time control circuit. The drain of the high-voltage NMOS transistor M5 is connected to the common ground terminal GND; the drain of the high-voltage PMOS transistors PMOS5 and the drain of the high-voltage NMOS transistors PMOS5 are connected together to generate the output signal Vs of the level shift circuit, and to control the turn-on state and the turn-off state of the heavy-current output stage.

The dead time control circuit is configured to generate inverse non-overlapping first logic switch signal S1 and second logic switch signal S2 using a pulse width modulation signal in the switching power supply.

When the pulse width modulation signal is converted from a low level to a high level, the first logic switch signal S1 is converted from a high level to a low level, then the pulse width modulation signal is delayed by the gate circuit and the capacitor, and the second logic switch signal S2 is converted from a high level to a low level.

When the pulse width modulation signal is converted from a high level to a low level, the second logic switch signal S2 is converted from a high level to a low level, then the pulse width modulation signal is delayed by the gate circuit and the capacitor, and the first logic switch signal S1 is converted from a low level to a high level.

The heavy-current output stage includes a Darlington configuration with a great sink current capability and a combined high voltage NMOS pull-down transistor with a great source current capability.

The Darlington configuration consists of transistors Q1 and Q2, diodes D1 and D2.

A collector of the Q1 and Q2 is connected to a common power supply VDD; a base of the transistor Q2 is connected to an N-terminal of the diode D2 and an end of the resistor R5. The N-terminal of the diode D2 and the end of the resistor R5 are connected to an output terminal $V_S$ of the level shift circuit. An emitter of transistor Q2 is connected to a P-terminal of the diode D2, an N-terminal of the diode D1, the other end of the resistor R5, an end of the resistor R6, and a base of the transistor Q1.

An emitter of the transistor Q1 is connected to the other end of the resistor R6, and a P-terminal of the diode D1; the other end of the resistor R6 and the P-terminal of the diode D1 are connected to an output terminal GATE_DRIVER of the high current output stage.

The combined high voltage NMOS pull-down transistor consists of high-voltage NMOS transistors M1, M2 and M5 and resistors R5 and R6.

A drain of the high-voltage NMOS transistor M1 is connected to an emitter of transistor Q1 and an end of the resistor R6; the emitter of transistor Q1 and the end of the resistor R6 are connected to the output stage GATE_DRIVER of the high current output stage. A drain of the high-voltage NMOS transistor M2 is connected to a base of transistor Q1, an emitter of transistor Q2, the N-terminal of the diode D1, and the P-terminal of the diode D2. A drain of the high-voltage NMOS transistors M5 is connected to a base of transistor Q2 and an end of the resistor R5; the base of transistor Q2 and the end of the resistor R5 are connected to the output $V_S$ of the level shifter circuit. The gates of the high-voltage NMOS transistors M1, M2 and M5 are connected together and connected to the second switch logic signal S2 generated by the dead time control circuit; the sources of the high-voltage NMOS transistors M1, M2 and M5 are connected to the common ground GND.

The present invention has the following advantages:

1. The isolation of the high-voltage LDMOS transistor and the breakdown voltage characteristics of the zener diode are utilized in the present invention, the higher input supply voltage is converted to the fixed level desired for the output driver switch signal. The reliability of the drive circuit is improved, and the peripheral power devices are also effectively protected.

2. In the present invention, since the level shift circuit is used, the pulse width modulation signal generated from the digital logic drive circuit is converted to the output drive switch signal with the fixed level; while the dead time control circuit is added to prevent the phenomenon of the transient heavy-current from the power supply to the ground during the level conversion.

3. The present invention uses the classic Darlington output stage structure to improve the capability of the source current and sink current of the output driver circuit.

4. For the requirements of the active power factor correction circuit for the total harmonic distortion (THD), a THD optimization mechanism is particularly added to the submodule circuit to reduce the THD.

DETAILED DESCRIPTION OF THE EMBODIMENTS

Reference will now be made to the drawings to describe, in detail, embodiments of the present invention. Embodiments of the invention are described more fully hereinafter with reference to the accompanying drawings. The various embodiments of the invention may, however, be embodied in many, different forms and should not be construed as limited to the embodiments set forth herein.

The terminology will be described in accordance with the definitions set out below.

THD: Total Harmonic Distortion;
EMI: Electromagnetic interference;
MOS: metal oxide semiconductor;
LDMOS: Later double-diffused metal oxide semiconductor;
NMOS: N-channel metal oxide semiconductor FET;
PMOS: P-channel metal oxide semiconductor FET.

In order to make the objects, the technical solutions, and the advantages of the present invention more clearly, reference will now be made to the drawings to describe, in detail, embodiments of the present invention.

Figure 1:
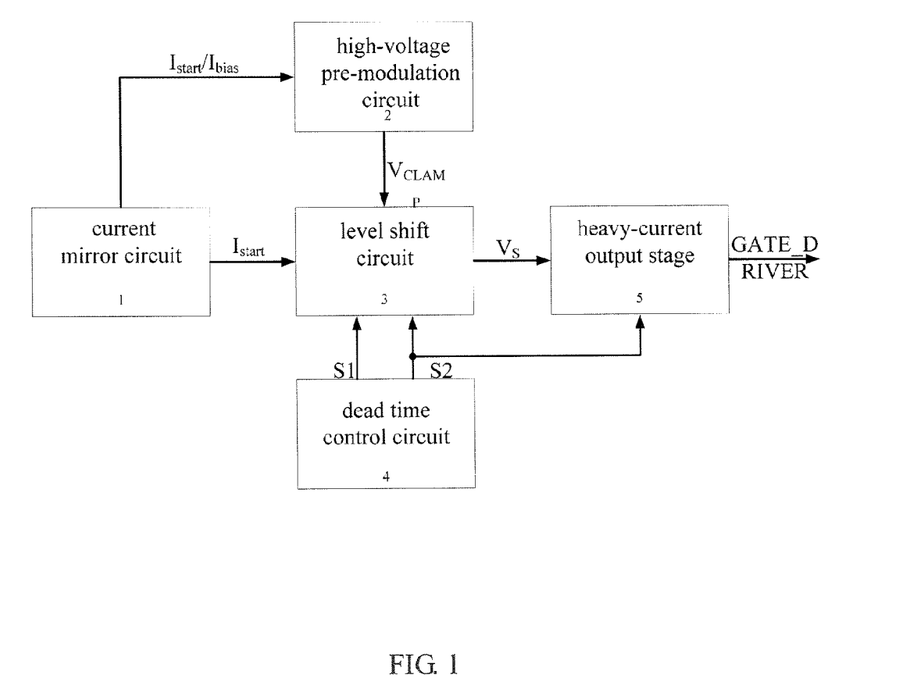
FIG. 1 is a block diagram of a driver circuit applied in a power factor corrector according to the present invention.

Referring to FIG. 1, a high-voltage heavy-current drive circuit applied in a power factor corrector of the present invention includes: a current mirror circuit 1, a high-voltage pre-modulation circuit 2, a level shift circuit 3, a dead time control circuit 4, and a heavy-current output stage 5.

Figure 2:
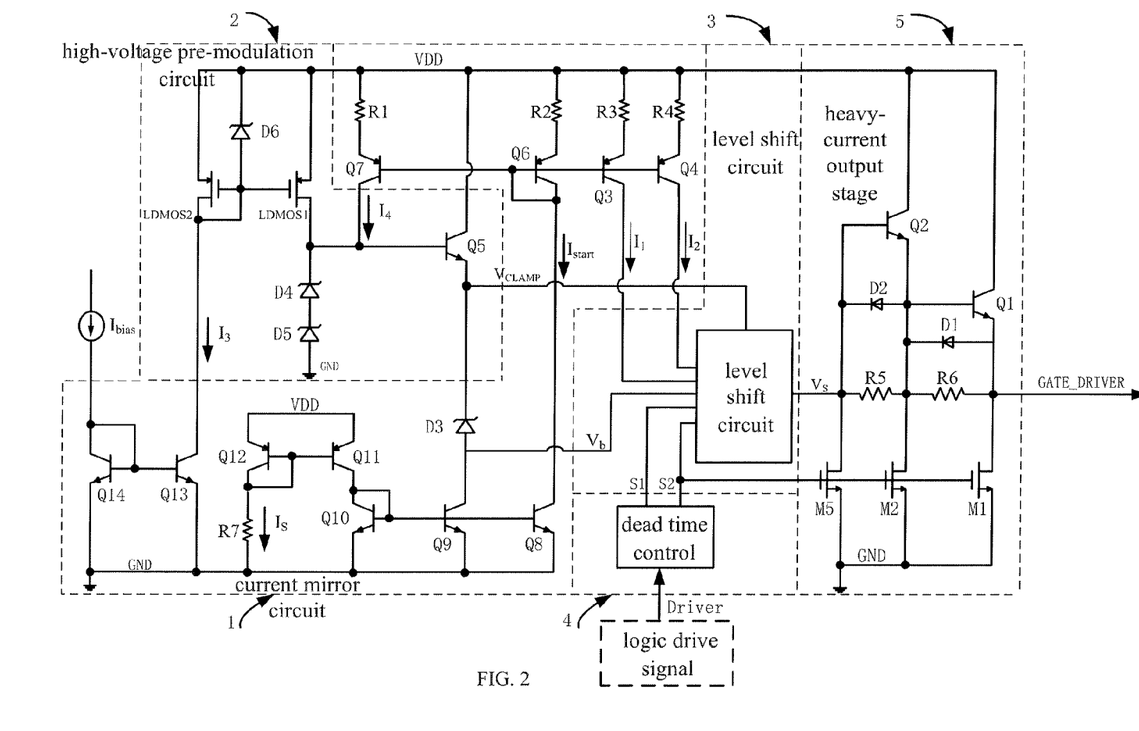
FIG. 2 illustrates a specific schematic circuit diagram according to the present invention.

Referring to FIG. 2, the structure and working principle of each unit circuit of the present invention are as follows:

The current mirror circuit 1:

The current mirror circuit includes transistors Q3, Q4, Q6, Q7, Q8, Q9, Q10, Q11, Q12, Q13, and Q12 and resistors R1, R2, R3, R4, and R7. The first current mirror circuit consists of the transistor Q13 and the transistor Q14. The second mirror circuit consists of the transistors Q3, Q4, Q6, Q7, Q8, Q9, Q10, Q11, Q12 and the resistors R1, R2, R3, R4, and R7. An input terminal of the Q14 of the first current mirror circuit is connected to an output terminal $I_{bias}$ of an external reference current source. $I_3$ is the output current of the Q13 of the first current mirror circuit, which provides a bias current for the third current mirror circuit of the high voltage pre-modulation circuit. The second current mirror circuit is the most important part of the THD optimization mechanism in the present invention. $I_4$ is the output current of the Q7 of the second current mirror circuit, which provides a charging current for the clamp circuit. $I_{start}$ is the output current of the Q8 of the first current mirror circuit, which provides mirror current for the other mirror circuit in the second current mirror circuit. In the active power factor correction controller, the required VDD voltage when the circuit is in a normal work is generally much higher, so if the transient voltage VDD reaches the desired voltage to open the circuit, an overshoot effect will occur on the output terminal, and the problems of the THD and EMI will become very serious, even the external power switch transistor will be burned. In the present invention, the THD optimization mechanism is added; when the voltage VDD lower circuit fails to work normally, the first current mirror circuit provides a start current $I_S$:

$$I_S = (VDD - V_{BE\_Q12})/R7 \quad (1)$$

The current is generated at $VDD > V_{BE\_Q12}$; and the current is mirrored out via the mirror circuit. Firstly, the current $I_S$ is mirrored to the output current the $I_{start}$ of the Q8; and the current is mirrored by the $I_4$ to charge the clamping diodes D4 and D5, and the Q5 will be turned on. Accordingly, the output voltage $V_{CLAMP}$ of the high-voltage pre-modulation circuit will follow the change of the input voltage, when the instantaneous VDD reaches the desired voltage for opening the circuit, the voltage $V_{CLAMP}$ does not change instantaneously, the overshoot change will not occur on the output terminal. The THD is greatly optimized, and the EMI problems are reduced. Furthermore, $I_1$ provides an output current for the Q3 of the second current mirror circuit, and $I_2$ provides an output current for the Q4 of the second current mirror circuit, $I_1$ and $I_2$ provide a bias current for the level shift circuit.

The High-Voltage Pre-Modulation Circuit 2:

The circuit includes LDMOS transistors LDMOS1 (hereinafter referred to as high-voltage transistor LDMOS1) and LDMOS2 (hereinafter referred to as high-voltage transistor LDMOS2), zener diodes D4, D5, and D6, and a transistor Q5. The third current mirror circuit consists of the high-voltage transistor LDMOS1 and the high-voltage transistor LDMOS2. The high-voltage transistor LDMOS1 is used as the first high-voltage isolation transistor of the high-voltage pre-modulation circuit. The high-voltage transistor LDMOS2 provides a suitable bias voltage for the gate of the high-voltage transistor LDMOS1. The zener diode D6 is used as the clamping protection diode of the gate of the third current mirror circuit and is configured to ensure that the voltages of the gates of the high-voltage transistor LDMOS1 and the high-voltage transistor LDMOS2 are in the range of the breakdown voltage. The zener diodes D4 and D5 are connected in series to form the core unit of the high voltage pre-modulation circuit. When the input power supply voltage VDD is relatively high to the breakdown voltage of the zener diodes D4 and D5, while the second high voltage isolation transistor Q5 is turned on, and the output voltage $V_{CLAMP}$ of the high voltage pre-modulation circuit is stable at the voltage twice of the breakdown voltage of the zener diode.

Figure 3:
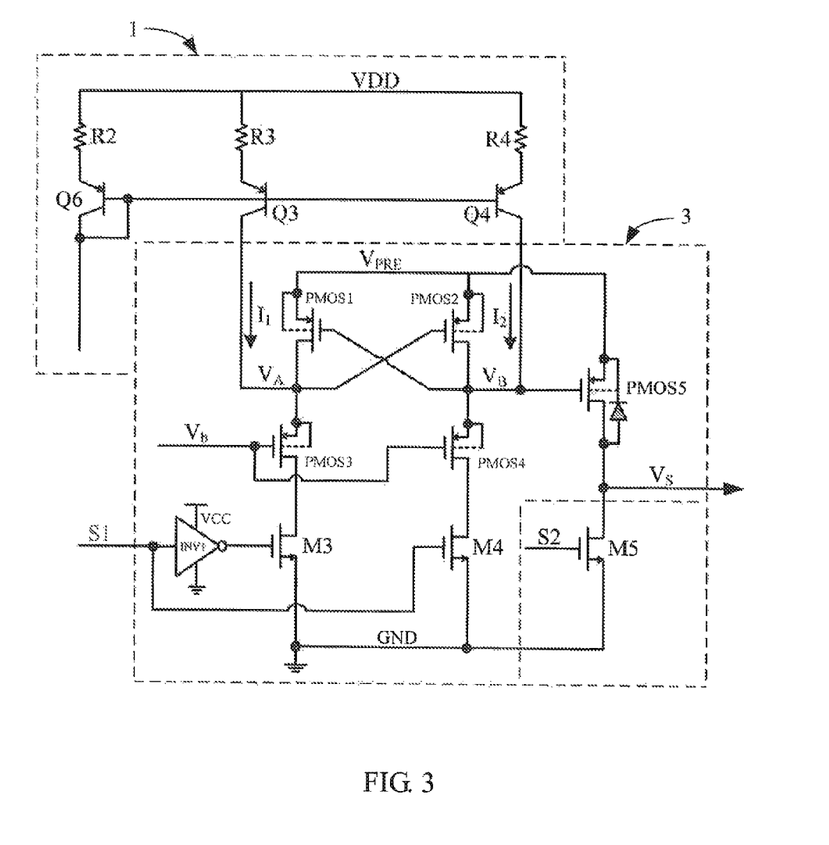
FIG. 3 illustrates a specific schematic circuit diagram of a level shift circuit 3 according to the present invention.

The Level Shift Circuit 3:

Referring to FIG. 3, the level shift circuit 3 includes high-voltage MOS transistors PMOS1, PMOS2, PMOS3, PMOS4, PMOS5, and NMOS5, high voltage NMOS transistors M3 and M4, and an inverter INV1. $I_1$ provides an output current for the Q3 of the second current mirror circuit, and $I_2$ provides an output current for the Q4 of the second current mirror circuit, $I_1$ and $I_2$ provide a current for the level shift circuit. The gates of the high-voltage MOS transistor PMOS3 and PMOS4 are connected to a collector $V_b$ of the transistor Q9. When a pulse width modulation signal Driver is converted from a low level to a high level, a first logic switch signal S1 is converted from a high level to a low level. The NMOS transistor M3 is turned on and the NMOS transistor M4 is turned off. Under the effect of the $V_b$ and the bias current $I_1$, the NMOS transistor M3 is turned on, the gate voltage of the PMOS2 $V_A \approx V_b + VGS3$. The PMOS2 is also turned on, the gate voltage $V_B$ of the PMOS5 transistor approximates to the input supply voltage $V_{CLAMP}$. The high voltage transistor PMOS1 and PMOS5 are turned off. After the pulse width modulation signal is delayed by the gate circuit and the capacitor, the second logic switch signal S2 is converted from a high level to a low level; and the NMOS transistor M5 is turned on, the $V_S$ outputs a low level. When the pulse width modulation signal is converted from a high level to a low level, the second logic switch signal S2 is converted from a high level to a low level, the NMOS transistor M5 is turned off. After pulse width modulation signal is delayed by the gate circuit and the capacitor, the first logic switch signal S1 is converted from a low level to a high level, the high NMOS transistor M3 is turned off, and the NMOS transistor M4 is turned on. Under the effect of the voltage $V_b$ and input bias current $I_2$, the high voltage transistor PMOS4 is turned on, the voltages of the gates of the PMOS1 and PMOS5 $V_B \approx V_b + VGS4$, while the PMOS1 and PMOS5 are turned on, the voltage $V_A$ of the gate of the voltage transistor PMOS2 approximates to the input supply voltage $V_{CLAMP}$. The high voltage transistor PMOS2 is turned off, the $V_S$ outputs a high level. After the dead time control circuit is added, the phenomenon of the transient heavy-current from the power supply to the ground during the level conversion is prevented.

Figure 4:
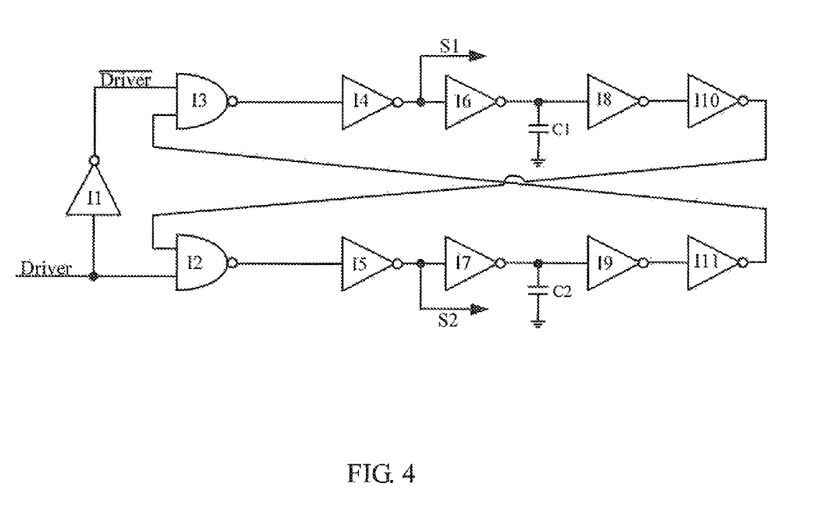
FIG. 4 illustrates a specific schematic circuit diagram of a dead time control circuit 4 according to the present invention.
Figure 5:
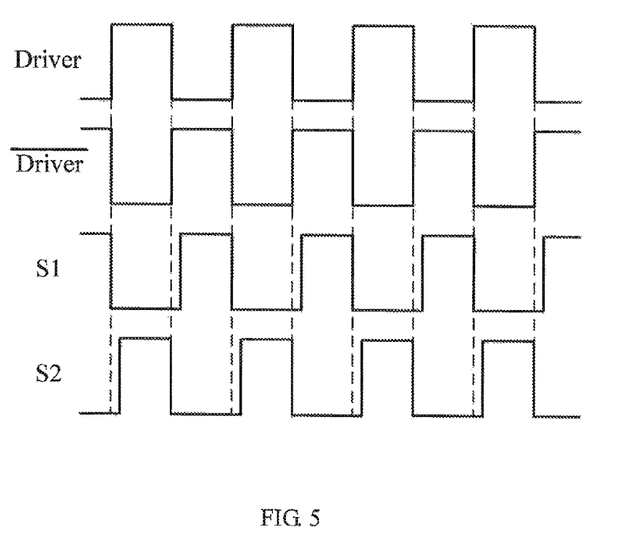
FIG. 5 illustrates an output signal timing diagram of the dead time control circuit 4 according to the present invention.

Dead Time Control Circuit 4:

Referring to FIG. 4 and FIG. 5, the dead time control circuit 4 is configured to generate an inverse non-overlapping first logic switch signal S1 and second logic switch signal S2 using a pulse width modulation signal Driver in the switching power supply. when the pulse width modulation signal is converted from the low level to the high level, the first logic switch signal S1 is converted from a high level to a low level, after the pulse width modulation signal is delayed by the gate circuit and the capacitor, the second logic switch signal S2 is converted from a high level to a low level. When the pulse width modulation signal is converted from a high level to a low level, the second logic switch signal S2 is converted from a high level to a low level, after the pulse width modulation signal is delayed by the gate circuit and the capacitor, the first logic switch signal S1 is converted from a low level to a high level.

Heavy-Current Output Stage 5:

Referring to FIG. 2, FIG. 4, and FIG. 5, the heavy-current output stage 5 includes a Darlington configuration with a great sink current capability and a combined high voltage NMOS pull-down transistor with a great source current capability. The Darlington configuration consists of transistors Q1 and Q2, diodes D1 and D2. The combined high voltage NMOS pull-down transistor consists of high voltage NMOS transistors M1, M2, and M5, resistors 125 and R6. When the pulse width modulation signal Driver is at high level, the first logic switch signal S1 of the dead time control circuit is at low level, the second logic switch signal S2 is at high level, the output signal $V_S$ of the level shift circuit is at low level. Under the effect of the high voltage NMOS transistors M1, M2, and M5, the output GATE_DRIVER of the heavy-current output stage is pulled down. When the pulse width modulation signal Driver is at low level, the first logic switch signal S1 of the dead time control circuit is at high level, the second logic switch signal S2 is at low level, the high voltage NMOS pull-down transistors M1, M2 and M5 are in the off state, the output signal $V_S$ of the level shift circuit is at high level. Under the effect of the Darlington transistors Q1 and Q2, the output GATE_DRIVER of the heavy-current output stage is quickly charged to the high level. The resistors R5 and R6 of the heavy-current output stage are also the important parts of the THD optimization mechanism in the present invention. The main role of the resistors R5 and R6 is to limit the current of the output stage, and to prevent the output stage from generating transient overshoot, thus the THD is optimized. Furthermore, since the output drive signal GATE_DRIVER is connected to the peripheral power devices via a pin of a chip, a parasitic inductance is generated. An LC resonance circuit consists of the parasitic inductance and a gate parasitic capacitance of the power devices. After suitable resistors are added to the output stage circuit, during the level conversion of the output drive signal, the oscillation of the output drive signal is effectively inhibited to reduce the EMI problems. When the output drive signal GATE_DRIVER is converted from a high level to a low level, the diodes D1 and D2 provide a fast discharge path to the base of the Q1 and Q2 of the Darlington transistors to accelerate the shutdown of the Darlington combined transistors Q1 and Q2.

The present invention utilizes the isolation of the high-voltage LDMOS transistor and breakdown voltage characteristics of the zener diode, the higher input supply voltage is converted to the fixed level desired for the output driver switch signal, not only the reliability of the drive circuit is improved, but also the peripheral power devices are effectively protected. The present invention utilizes the level shift circuit; the pulse width modulation signal generated from the digital logic drive circuit is converted to a fixed level of the output drive switching signal, while the dead time control circuit is added to prevent the phenomenon of the transient heavy-current from the power supply to the ground during the level conversion. The present invention uses the classic Darlington output stage structure to improve the capability of the source current and sink current of the output driver circuit. For the requirements of the active power factor correction circuit for the total harmonic distortion (THD), a THD optimization mechanism is added in the sub-module circuit to reduce the THD.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A high-voltage heavy-current drive circuit applied in a power factor corrector, comprising a current mirror circuit (1), a high-voltage pre-modulation circuit (2), a level shift circuit (3), a dead time control circuit (4), and a heavy-current output stage (5);

wherein the current mirror circuit (1) is configured to convert an input signal ($I_{bias}$) to an input signal of the high voltage pre-modulation circuit using a current source circuit and a current sink circuit composed of a plurality of resistors and transistors, the input signal ($I_{bias}$) is generated by a starting current ($I_{start}$), and a reference current source, and the starting current ($I_{start}$) is converted to an input signal of the level shift circuit;

under an effect of a bias of the current mirror circuit (1), the high voltage pre-modulation circuit (2) is configured to convert a high input supply voltage (VDD) to a relative low voltage using an isolation of a high-voltage LDMOS transistor and stabilized breakdown voltage characteristics of a zener diode to ensure the drive circuit operating within a safe voltage range, and to generate an input voltage ($V_{CLAMP}$) of the level shift circuit;

under effects of an output of the high-voltage pre-modulation circuit (2) and the bias of the current mirror circuit (1), the level shift circuit (3) is configured to control on and off states of a high-voltage transistor PMOS and a high-voltage transistor NMOS using a first logic switch signal (S1) and a second switch logic signal (S2) generated by the dead time control circuit; thereby generating an output signal (Vs) of the level shift circuit to provide a logic switch signal for the heavy-current output stage;

under an effect of a digital logic drive signal, using delays of a logic gate circuit and capacitors, the dead time control circuit (4) is configured to generate inverse non-overlapping first logic switch signal (S1) and second logic switch signal (S2), and to control operating states of the level shift circuit and the heavy-current output stage;

under an effect of a Darlington circuit composed of high voltage transistors, using the logic switch signal ($V_S$) generated by the high-voltage transistor NMOS and the level shift circuit and a second logic switch signal (S2) generated by the dead time control circuit, the high current output stage (3) is configured to generate an output drive signal (GATE_DRIVER) with great source current capability and sink current capability and to drive on and off states of an external power device.

2. The high-voltage heavy-current drive circuit according to claim 1, wherein the current mirror circuit (1) comprises transistors (Q3, Q4, Q6, Q7, Q8, Q9, Q10, Q11, Q12, Q13, and Q14), and resistors (R1, R2, R3, R4, and R7); a first current mirror circuit consists of the transistor (Q13) and the transistor (Q14); a second current mirror circuit consists of the transistors (Q3, Q4, Q6, Q7, Q8, Q9, Q10, Q11, and Q12) and the resistors (R1, R2, R3, R4, and R7); an input terminal of the first current mirror circuit is connected to an output terminal ($I_{bias}$) of an external reference current source; the first current mirror circuit is configured to provide a bias current for the high-voltage pre-modulation circuit when the circuit is operating normally; the second current mirror circuit is configured to provide a bias current for the high-voltage pre-modulation circuit and the level shift circuit.

3. The high-voltage heavy-current drive circuit according to claim 1, wherein the high-voltage pre-modulation circuit comprises an LDMOS transistor (LDMOS1), an LDMOS transistor (LDMOS2), zener diodes (D4, D5, and D6), and a transistor (Q5); a third current mirror circuit consists of the LDMOS transistor (LDMOS1) and the LDMOS transistors (LDMOS2); the LDMOS transistor (LDMOS1) is used as a first high-voltage insulating transistor of the high pre-modulation circuit; the LDMOS transistor (LDMOS2) is used as a gate bias transistor of the LDMOS transistor (LDMOS1); the zener diode (D6) is used as a gate clamping protection of the third current mirror circuit; the zener diodes (D4 and D5) are connected in series to form a first high-voltage pre-modulation circuit; the transistor (Q5) is used as a second high-voltage insulating transistor of the high pre-modulation circuit.

4. The high-voltage heavy-current drive circuit according to claim 3, wherein in the high-voltage pre-modulation circuit (2), a gate and a drain of the LDMOS transistor (LDMOS2) in the third current mirror circuit are connected together and connected to an output terminal of a collector of the transistor (Q13) in the first current mirror circuit; a source of the LDMOS transistor (LDMOS1) and the LDMOS transistors (LDMOS2) is connected to the input power supply (VDD); a clamping diode (D6) is coupled between the gate and the source of the LDMOS transistor (LDMOS1) and the LDMOS transistors (LDMOS2) in the third current mirror circuit; a drain terminal of the LDMOS transistor (LDMOS1) is connected to an N terminal of clamping diodes (D4 and D5) connected in series, and also connected to a base of the transistor (Q5), and an output terminal of a collector of the transistor (Q7) in the second current mirror circuit; a high voltage pre-modulation signal ($V_{CLAMP}$) is generated on an emitter of the transistor (Q5).

5. The high-voltage heavy-current drive circuit according to claim 1, wherein the level shift circuit (3) comprises high-voltage PMOS transistors, (PMOS1, PMOS2, PMOS3, PMOS4, and PMOS5), high-voltage NMOS transistors (M3, M4, and M5), and an inverter (INV1);

a source of the high-voltage PMOS transistors, (PMOS1, PMOS2, and PMOS5) is connected to a common power supply ($V_{CLAMP}$), namely, is connected to an output terminal of the high-voltage pre-modulation circuit (2);

a gate of the high-voltage PMOS transistor (PMOS1) is connected to a drain of the high-voltage PMOS transistor (PMOS2), a drain of the high-voltage PMOS transistor (PMOS1) is connected to a gate of the high-voltage PMOS transistor (PMOS2) and a source of the high-voltage PMOS transistor (PMOS3);

under an effect of a bias of a second current mirror circuit in the current mirror circuit, a collector of an output terminal of a transistor (Q3) of the second current mirror circuit is connected to the drain of the high-voltage PMOS transistor (PMOS1), the gate of the high-voltage PMOS transistor (PMOS2), and the source of the high-voltage PMOS transistor (PMOS3) to be a bias current of the level shift circuit;

the gate of the high-voltage PMOS transistor (PMOS2) is connected to the drain of the high-voltage PMOS transistor (PMOS1); the drain of the high-voltage PMOS transistor (PMOS2) is connected to the gate of the high-voltage PMOS transistor (PMOS1), a source of the high-voltage PMOS transistor (PMOS4), and a gate of the high-voltage PMOS transistor (PMOS5);

under an effect of the bias of the second current mirror circuit in the current mirror circuit (1), an output terminal of a collector of a transistor (Q4) of the second current mirror circuit is connected to the gate of the high-voltage PMOS transistor (PMOS1), the source of the high-voltage PMOS transistor (PMOS4), and the gate of the high-voltage PMOS transistor (PMOS5), to provide a bias current for the level shift circuit (3);

the gates of the high-voltage PMOS transistors (PMOS3 and PMOS4) are connected to a common terminal ($V_b$); the drain of the high-voltage PMOS transistors (PMOS3) is connected to a drain of the high-voltage NMOS transistor (M3); the drain of the high-voltage PMOS transistors (PMOS4) is connected to a drain of the high-voltage NMOS transistor (M4); a gate of the high-voltage NMOS transistor (M3) is connected to an output terminal of the inverter (INV1); a source of the high-voltage NMOS transistor (M3) is connected to a common terminal (GND);

an input terminal of the inverter (INV1) is connected to the first logic switch signal (S1) generated by the dead time control circuit; a gate of the high-voltage NMOS transistor (M4) is connected to the input terminal of inverter (INV1), namely, is connected to the first logic switch signal (S1); a source of the high-voltage NMOS transistor (M4) is connected to the common (GND); the gate of the high-voltage NMOS transistor (PMOS5) is connected to the drain of the high-voltage NMOS transistor (M2), the gate of the (PMOS1), and the source of the (PMOS4);

the source of the high-voltage NMOS transistor (PMOS5) is connected to the output ($V_{CLAMP}$) of the high voltage pre-modulation circuit (2);

the drain of the high-voltage PMOS transistor (PMOS5) is connected to the drain of high-voltage NMOS transistor (M5); the gate of the high-voltage NMOS transistor (M5) is connected to the second switch logic signal (S2) generated by the dead time control circuit; the drain of the high-voltage NMOS transistor (M5) is connected to the common ground terminal (GND); the drain of the high-voltage PMOS transistors (PMOS5) and the drain of the high-voltage NMOS transistors (PMOS5) are connected together to generate the output signal (Vs) of the level shift circuit, and to control the turn-on state and the turn-off state of the heavy-current output stage (5).

6. The high-voltage heavy-current drive circuit according to claim 1, wherein the dead time control circuit (4) is configured to generate inverse non-overlapping first logic switch signal (S1) and second logic switch signal (S2) using a pulse width modulation signal in the switching power supply;

when the pulse width modulation signal is converted from a low level to a high level, the first logic switch signal (S1) is converted from a high level to a low level, then the pulse width modulation signal is delayed by the gate circuit and the capacitor, and the second logic switch signal (S2) is converted from a high level to a low level;

when the pulse width modulation signal is converted from a high level to a low level, the second logic switch signal (S2) is converted from a high level to a low level, then the pulse width modulation signal is delayed by the gate circuit and the capacitor, and the first logic switch signal (S1) is converted from a low level to a high level.

7. The high-voltage heavy-current drive circuit according to claim 1, wherein the heavy-current output stage (5) comprises a Darlington configuration with a great sink current capability and a combined high voltage NMOS pull-down transistor with a great source current capability;

the Darlington configuration consists of transistors (Q1 and Q2), diodes (D1 and D2);

a collector of the (Q1 and Q2) is connected to a common power supply (VDD); a base of the transistor (Q2) is connected to an N-terminal of the diode (D2) and an end of the resistor (R5);

the N-terminal of the diode (D2) and the end of the resistor (R5) are connected to an output terminal $V_S$ of the level shift circuit; an emitter of transistor Q2 is connected to a P-terminal of the diode (D2), an N-terminal of the diode (D1), the other end of the resistor (R5), an end of the resistor R6, and a base of the transistor (Q1);

an emitter of the transistor (Q1) is connected to the other end of the resistor (R6), and a P-terminal of the diode (D1); the other end of the resistor (R6) and the P-terminal of the diode (D1) are connected to an output terminal (GATE_DRIVER) of the high current output stage;

the combined high voltage NMOS pull-down transistor consists of high-voltage NMOS transistors (M1, M2 and M5) and resistors (R5 and R6);

a drain of the high-voltage NMOS transistor (M1) is connected to an emitter of transistor (Q1) and an end of the resistor (R6); the emitter of transistor (Q1) and the end of the resistor (R6) are connected to the output stage (GATE_DRIVER) of the high current output stage; a drain of the high-voltage NMOS transistor (M2) is connected to a base of transistor (Q1), an emitter of transistor (Q2), the N-terminal of the diode (D1), and the P-terminal of the diode (D2); a drain of the high-voltage NMOS transistors (M5) is connected to a base of transistor (Q2) and an end of the resistor (R5); the base of transistor (Q2) and the end of the resistor (R5) are connected to the output ($V_S$) of the level shifter circuit; the gates of the high-voltage NMOS transistors (M1, M2 and M5) are connected together and connected to the second switch logic signal (S2) generated by the dead time control circuit; the sources of the high-voltage NMOS transistors (M1, M2 and M5) are connected to the common ground (GND).

* * * * *